(12) United States Patent
Chen

(10) Patent No.: US 7,209,524 B2
(45) Date of Patent: Apr. 24, 2007

(54) LAYERED MODULATION FOR DIGITAL SIGNALS

(75) Inventor: Ernest C. Chen, San Pedro, CA (US)

(73) Assignee: The DirecTV Group, Inc., El Segundo, CA (US)

(*) Notice: Subject to any disclaimer, the term of this patent is extended or adjusted under 35 U.S.C. 154(b) by 691 days.

(21) Appl. No.: 09/844,401

(22) Filed: Apr. 27, 2001

(65) Prior Publication Data

US 2002/0181604 A1 Dec. 5, 2002

(51) Int. Cl.
*H04L 27/04* (2006.01)

(52) U.S. Cl. .................................... 375/295; 375/324
(58) Field of Classification Search ............... 375/262, 375/265, 279, 281, 287, 298, 308, 341, 316, 375/329, 332, 295; 370/464, 201, 334
See application file for complete search history.

(56) References Cited

U.S. PATENT DOCUMENTS

| | | |
|---|---|---|
| 3,076,180 A | 1/1963 | Havens et al. |
| 3,383,598 A | 5/1968 | Sanders |
| 3,878,468 A | 4/1975 | Falconer et al. |
| 3,879,664 A | 4/1975 | Monsen |
| 3,974,449 A | 8/1976 | Falconer |
| 4,039,961 A | 8/1977 | Ishio et al. |
| 4,068,186 A | 1/1978 | Sato et al. |
| 4,213,095 A | 7/1980 | Falconer |
| 4,253,184 A | 2/1981 | Gitlin et al. |
| 4,283,684 A | 8/1981 | Satoh |
| 4,384,355 A | 5/1983 | Werner |
| RE31,351 E | 8/1983 | Falconer |
| 4,416,015 A | 11/1983 | Gitlin |
| 4,500,984 A | 2/1985 | Shimbo et al. |
| 4,519,084 A | 5/1985 | Langseth |
| 4,594,725 A | 6/1986 | Desperben et al. |
| 4,628,507 A | 12/1986 | Otani |
| 4,637,017 A | 1/1987 | Assal et al. |
| 4,647,873 A | 3/1987 | Beckner et al. |
| 4,654,863 A | 3/1987 | Belfield et al. |
| 4,670,789 A | 6/1987 | Plume |
| 4,709,374 A | 11/1987 | Farrow |

(Continued)

FOREIGN PATENT DOCUMENTS

DE 3642213 12/1986

(Continued)

OTHER PUBLICATIONS

Ramchandran, Kannan et al., *Multiresolution Broadcast for Digital HDTV Using Joint Source/Channel Coding*, IEEE, vol. 11, No. 1, Jan. 1993, pp. 6–22.

(Continued)

*Primary Examiner*—Emmanuel Bayard
(74) *Attorney, Agent, or Firm*—Georgann S. Grunebach

(57) ABSTRACT

Signals, systems and methods for transmitting and receiving layered modulation for digital signals are presented. A layered signal for transmitting data, comprises a first signal layer including a first carrier and first signal symbols for a first digital signal transmission and a second signal layer including a second carrier and second signal symbols for a second signal, transmission disposed on the first signal layer, wherein the layered signal has the first carrier demodulated and first layer decoded to produce the first signal symbols for a first layer transport, the first signal symbols are remodulated and subtracted from the layered signal to produce the second signal layer, and the second signal layer has the second carrier demodulated and decoded to produce the second signal symbols for a second layer transport.

45 Claims, 6 Drawing Sheets

U.S. PATENT DOCUMENTS

| | | | |
|---|---|---|---|
| 4,800,573 A * | 1/1989 | Cupo | 375/234 |
| 4,835,790 A | 5/1989 | Yoshida et al. | |
| 4,847,864 A | 7/1989 | Cupo | |
| 4,860,315 A | 8/1989 | Hosoda et al. | |
| 4,878,030 A | 10/1989 | Vincze | |
| 4,896,369 A | 1/1990 | Adams et al. | |
| 4,918,708 A | 4/1990 | Pottinger et al. | |
| 4,993,047 A | 2/1991 | Moffat et al. | |
| 5,088,110 A | 2/1992 | Bonnerot et al. | |
| 5,111,156 A | 5/1992 | Keate et al. | |
| 5,121,414 A | 6/1992 | Levine et al. | |
| 5,199,047 A | 3/1993 | Koch | |
| 5,221,908 A | 6/1993 | Katz et al. | |
| 5,229,765 A | 7/1993 | Gardner | |
| 5,233,632 A | 8/1993 | Baum et al. | |
| 5,285,480 A | 2/1994 | Chennakeshu et al. | |
| 5,317,599 A | 5/1994 | Obata | |
| 5,329,311 A | 7/1994 | Ward et al. | |
| 5,430,770 A | 7/1995 | Abbey | |
| 5,450,623 A | 9/1995 | Yokoyama et al. | |
| 5,467,197 A * | 11/1995 | Hoff | 386/83 |
| 5,493,307 A | 2/1996 | Tsujimoto | |
| 5,555,257 A | 9/1996 | Dent | |
| 5,557,067 A | 9/1996 | Messelhi | |
| 5,577,067 A | 11/1996 | Zimmerman | |
| 5,577,087 A | 11/1996 | Furuya | |
| 5,579,344 A | 11/1996 | Namekata | |
| 5,581,229 A | 12/1996 | Hunt | |
| 5,602,868 A | 2/1997 | Wilson | |
| 5,603,084 A | 2/1997 | Henry et al. | |
| 5,606,286 A | 2/1997 | Bains | |
| 5,625,640 A * | 4/1997 | Palmer et al. | 375/132 |
| 5,642,358 A | 6/1997 | Dent | |
| 5,648,955 A | 7/1997 | Jensen et al. | |
| 5,732,113 A | 3/1998 | Schmidl et al. | |
| 5,793,818 A | 8/1998 | Claydon et al. | |
| 5,815,531 A | 9/1998 | Dent | |
| 5,828,710 A | 10/1998 | Beale | |
| 5,848,060 A | 12/1998 | Dent | |
| 5,870,443 A | 2/1999 | Rahnema | |
| 5,940,025 A | 8/1999 | Koehnke et al. | |
| 5,956,373 A | 9/1999 | Goldston et al. | |
| 5,960,040 A | 9/1999 | Cai et al. | |
| 5,963,845 A | 10/1999 | Floury et al. | |
| 5,966,048 A | 10/1999 | Thompson | |
| 5,966,186 A | 10/1999 | Shigihara et al. | |
| 5,966,412 A | 10/1999 | Ramaswamy | |
| 5,970,098 A | 10/1999 | Herzberg | |
| 5,987,068 A | 11/1999 | Cassia et al. | |
| 6,008,692 A | 12/1999 | Escartin | |
| 6,018,556 A | 1/2000 | Janesch et al. | |
| 6,021,159 A | 2/2000 | Nakagawa | |
| 6,028,894 A | 2/2000 | Oishi et al. | |
| 6,032,026 A | 2/2000 | Seki et al. | |
| 6,034,952 A | 3/2000 | Dohi et al. | |
| 6,055,278 A | 4/2000 | Ho et al. | |
| 6,061,393 A | 5/2000 | Tsui et al. | |
| 6,084,919 A | 7/2000 | Kleider et al. | |
| 6,108,374 A | 8/2000 | Balachandran et al. | |
| 6,125,148 A | 9/2000 | Frodigh et al. | |
| 6,128,357 A | 10/2000 | Lu et al. | |
| 6,131,013 A | 10/2000 | Bergstrom et al. | |
| 6,140,809 A | 10/2000 | Doi | |
| 6,141,534 A | 10/2000 | Snell et al. | |
| 6,144,708 A | 11/2000 | Maruyama | |
| 6,166,601 A | 12/2000 | Shalom et al. | |
| 6,178,158 B1 | 1/2001 | Suzuki et al. | |
| 6,188,717 B1 | 2/2001 | Kaiser et al. | |
| 6,212,360 B1 | 4/2001 | Fleming et al. | |
| 6,219,095 B1 | 4/2001 | Zhang et al. | |
| 6,249,180 B1 | 6/2001 | Maalej et al. | |
| 6,266,534 B1 * | 7/2001 | Raith et al. | 455/456.3 |
| 6,272,679 B1 | 8/2001 | Norin | |
| 6,275,678 B1 | 8/2001 | Bethscheider et al. | |
| 6,304,594 B1 | 10/2001 | Salinger | |
| 6,307,435 B1 | 10/2001 | Nguyen et al. | |
| 6,320,919 B1 | 11/2001 | Khayrallah et al. | |
| 6,330,336 B1 | 12/2001 | Kasama | |
| 6,333,924 B1 | 12/2001 | Porcelli et al. | |
| 6,366,309 B1 | 4/2002 | Siegle | |
| 6,369,648 B1 | 4/2002 | Kirkman | |
| 6,892,068 B2 | 4/2002 | Karabinis et al. | |
| 6,389,002 B1 | 5/2002 | Schilling | |
| 6,411,659 B1 | 6/2002 | Liu et al. | |
| 6,411,797 B1 | 6/2002 | Estinto | |
| 6,426,822 B1 | 7/2002 | Winter et al. | |
| 6,429,740 B1 | 8/2002 | Nguyen et al. | |
| 6,433,835 B1 * | 8/2002 | Hartson et al. | 348/608 |
| 6,477,398 B1 | 11/2002 | Mills | |
| 6,515,713 B1 | 2/2003 | Nam | |
| 6,535,497 B1 | 3/2003 | Raith | |
| 6,574,235 B1 * | 6/2003 | Arslan et al. | 370/464 |
| 6,597,750 B1 * | 7/2003 | Knutson et al. | 375/347 |
| 6,718,184 B1 * | 4/2004 | Aiken et al. | 455/562.1 |
| 6,731,700 B1 | 5/2004 | Yakhnich et al. | |
| 6,745,050 B1 * | 6/2004 | Forsythe et al. | 455/561 |
| 6,775,521 B1 | 8/2004 | Chen | |
| 6,934,314 B2 | 8/2005 | Harles et al. | |
| 6,970,496 B1 | 11/2005 | Ben-Bassat et al. | |
| 2001/0012322 A1 | 8/2001 | Nagaoka et al. | |
| 2001/0024479 A1 | 9/2001 | Samarasooriya | |
| 2002/0006795 A1 | 1/2002 | Norin et al. | |
| 2002/0071506 A1 | 6/2002 | Lindquist et al. | |
| 2002/0158619 A1 | 10/2002 | Chen | |
| 2002/0176516 A1 | 11/2002 | Jeske et al. | |
| 2003/0002471 A1 | 1/2003 | Crawford et al. | |
| 2003/0138037 A1 | 7/2003 | Kaku et al. | |
| 2004/0146296 A1 | 7/2004 | Garszberg et al. | |
| 2005/0008100 A1 | 1/2005 | Chen | |
| 2006/0056541 A1 | 3/2006 | Chen et al. | |

FOREIGN PATENT DOCUMENTS

| | | |
|---|---|---|
| EP | 0222076 | 8/1986 |
| EP | 0 238 822 A2 | 9/1987 |
| EP | 0 356 096 A2 | 2/1990 |
| FR | 2696295 | 4/1994 |
| JP | 2-5631 | 1/1990 |
| JP | 2-95033 | 4/1990 |
| JP | 03139027 | 6/1991 |
| JP | 5-41683 | 2/1993 |
| JP | 5-114878 | 5/1993 |
| JP | 5-252084 | 9/1993 |
| JP | 07-038615 | 2/1995 |
| WO | WO 99/20001 | 4/1999 |
| WO | WO 01/80471 | 10/2001 |
| WO | WO 03/105375 | 12/2003 |
| WO | WO 2005/074171 | 8/2005 |
| WO | WO 2005/086444 | 9/2005 |

OTHER PUBLICATIONS

The Authoritive Dictionary of IEEE Standards Terms; Seventh Edition, p. 1047 –definition of "signal".

Chen, Ernest et al.; "DVB–S2 Backward–Compatible Modes: A Bridge Between the Present and the Future"; International Journal of Satellite Communications and Networking; vol. 22, Issue 3, pp. 341–365; published 2004 by John Wiley & Sons, Ltd.

Wolcott, Ted J. et al.; "Uplink–Noise Limited Satellite Channels"; IEEE 1995; pp. 717–721; XP–00580915.

Seskar, Ivan et al.; "Implementation Aspects for Successive Interface Cancellation in DS/CDMA Systems"; Wireless Networks; 1998; pp. 447–452.

Earth Station Technology; 1986; pp. 404–412; XP–002248387.

Meyr, Heinrich et al.; "Digital Communication Receivers: Synchronization, Channel Estimation, and Signal Processing"; 1998; John Wiley & Sons, pp. 610–612, XP002364876.

Meyr, Heinrich et al., "Digital Communication Receivers: Synchronization, Channel Estimation, and Signal Processing", 1998, John Wiley & Sons, pp. 212, 213, 217, 218, XP002364874.

Fant, T. et al., "Forth–Power Law Clock Recovery with Prefiltering", Proceedings of the International Conference on Communications (ICC), Geneva, May 23–26, 1993, New York, IEEE, US, vol. 3, May 23, 1993, pp. 811–815, XP010137089, ISBN: 0–7803–0950–2, Section 1, Introduction.

* cited by examiner

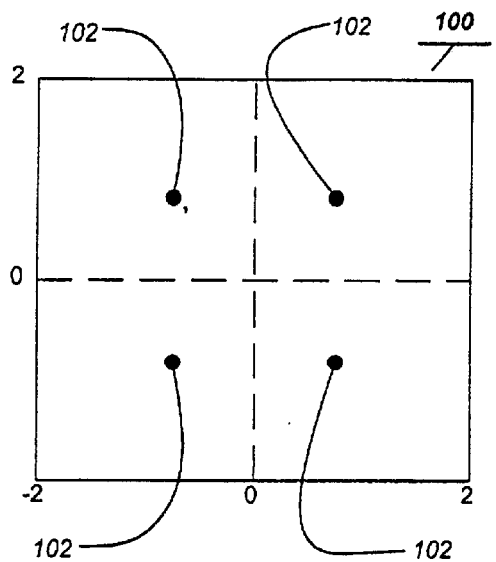
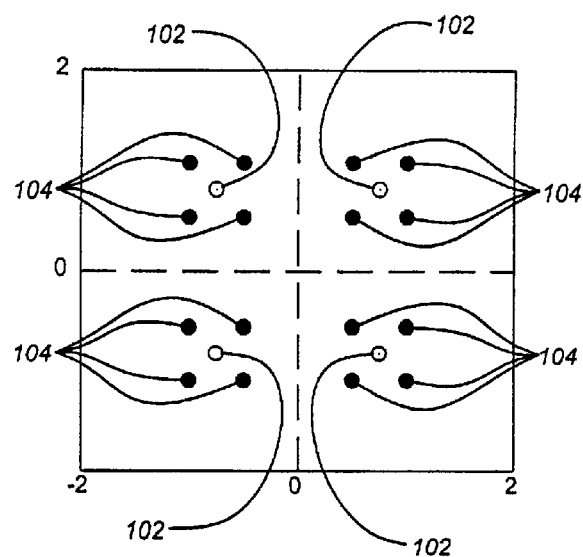
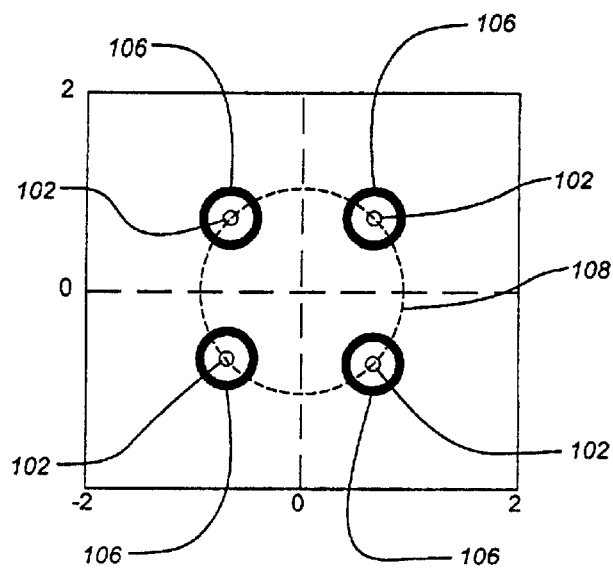
FIG. 1A  FIG. 1B
FIG. 1C

LAYERED MODULATION FOR DIGITAL SIGNALS

BACKGROUND OF THE INVENTION

1. Field of the Invention

The present invention relates generally to systems for transmitting and receiving digital signals, and in particular, to systems for broadcasting and receiving layered modulation in digital signals.

2. Description of the Related Art

Digital signal communication systems have been used in various fields, including digital TV signal transmission, either terrestrial or satellite.

As the various digital signal communication systems and services evolve, there is a burgeoning demand for increased data throughput and added services. However, it is more difficult to implement either improvement in old systems and new services when it is necessary to replace existing legacy hardware, such as transmitters and receivers. New systems and services are advantaged when they can utilize existing legacy hardware. In the realm of wireless communications, this principle is further highlighted by the limited availability of electromagnetic spectrum. Thus, it is not possible (or at least not practical) to merely transmit enhanced or additional data at a new frequency.

The conventional method of increasing spectral capacity is to move to a higher-order modulation, such as from quadrature phase shift keying (QPSK) to eight phase shift keying (8 PSK) or sixteen quadrature amplitude modulation (16 QAM). Unfortunately, QPSK receivers cannot demodulate conventional 8 PSK or 16 QAM signals. As a result, legacy customers with QPSK receivers must upgrade their receivers in order to continue to receive any signals transmitted with an 8 PSK or 16 QAM modulation.

It is advantageous for systems and methods of transmitting signals to accommodate enhanced and increased data throughput without requiring additional frequency. In addition, it is advantageous for enhanced and increased throughput signals for new receivers to be compatible with legacy receivers. There is further an advantage for systems and methods which allow transmission signals to be upgraded from a source separate from the legacy transmitter. The present invention obtains these advantages.

SUMMARY OF THE INVENTION

Signals, systems and methods for transmitting and receiving non-coherent layered modulation for digital signals are presented. For example, a layered signal for transmitting data, comprises a first signal layer including a first carrier and first signal symbols for a first digital signal transmission and a second signal layer including a second carrier and second signal symbols for a second signal transmission disposed on the first signal layer, wherein the layered signal has the first carrier demodulated and first layer decoded to produce the first signal symbols for a first layer transport, the first signal symbols are remodulated and subtracted from the layered signal to produce the second signal layer, and the second signal layer has the second carrier demodulated and decoded to produce the second signal symbols for a second layer transport.

A receiver of the invention receives the combined layered signal and demodulates it to produce the first carrier and a stable combined signal. The stable combined signal is decoded to produce first layer symbols which are provided to a first layer transport. The first layer symbols are also used to construct an idealized first layer signal. The idealized first layer signal is subtracted from the stable combined layered signal to produce the second layer signal. The second layer signal is demodulated, decoded and the output second layer symbols are provided to a second layer transport.

In the invention, a second (lower) layer of modulation is added to a first (upper) layer of modulation. Such an approach affords backwards-compatible implementation, i.e. legacy equipment can remain unchanged and continue to transmit and receive signals while new equipment may simultaneously transmit and receive enhanced signals. The addition of the second layer provides increased capacity and services to receivers that can process information from both layers. The upper and lower layer signals may be non-coherent; there is no required carrier phase relationship between the two signal layers.

Alternate embodiments may abandon backward compatibility with particular legacy equipment. However, layered modulation may still be used to provide expanded services with future system upgrades. Furthermore, as will be readily apparent to those skilled in the art, the principle of the invention may be extended to additional layers of modulation, with independent modulations, forward error correction (FEC) coding and code rates as the system may support in the future, while maintaining backward compatibility. The present invention provides many advantages.

For example, spectral efficiency may be significantly increased while maintaining backward compatibility with pre-existing receivers; if both layers use the same modulation with the same code rate, the spectral efficiency may be doubled. The present invention is more energy efficient and more bandwidth efficient than other backwards-compatible techniques using adapted 8 PSK and 16 QAM.

While it can achieve at least the spectral efficiency of a 16 QAM modulation, the new modulation of the present invention does not require a linear traveling wave tube amplifier (TWTA) as with 16 QAM. All layers may use QPSK or 8 PSK, which are much more insensitive to TWTA nonlinearity. Also, by using QPSK modulation for all layers in the present invention, there is no additional performance penalty imposed on 8 PSK or 16 QAM due to carrier phase recovery error.

Also with the present invention, because the signals of different layers are non-coherent there is no required coordination in transmitting the separate layers. Therefore, the signal of a new layer may be transmitted from a different TWTA or even a different satellite. This allows implementation of the backward-compatible scheme at a later date, such as when a TWTA can output sufficient power to support multiple-layered modulations.

In addition, in typical embodiment the upper layers of the present invention are much more robust to rain fade. Only the lower layer is subject to the same rain fade as the current signal waveform does. As the legacy signal level is moved up in power, existing subscribers will experience far fewer service disruptions from rain fade.

BRIEF DESCRIPTION OF THE DRAWINGS

Referring now to the drawings in which like reference numbers represent corresponding parts throughout:

FIGS. 1A–1C illustrate the relationship of signal layers in a layered modulation transmission;

DETAILED DESCRIPTION OF PREFERRED EMBODIMENTS

Figure 2A:
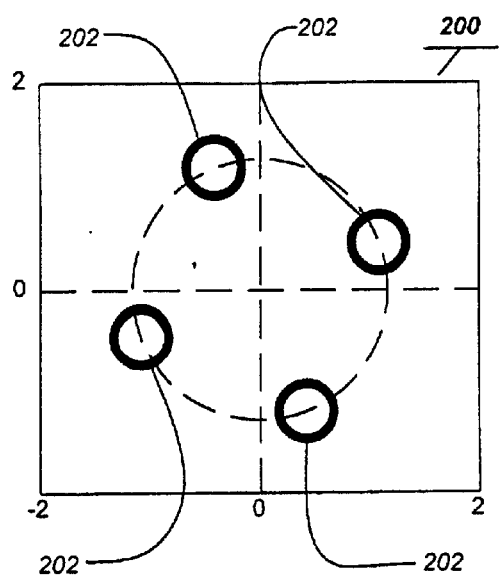
FIGS. 2A–2C illustrate a signal constellation of a second transmission layer over a first transmission layer non-coherently.

In the following description, reference is made to the accompanying drawings which form a part hereof, and which show, by way of illustration, several embodiments of the present invention. It is understood that other embodiments may be utilized and structural changes may be made without departing from the scope of the present invention.

Overview

The present invention provides for the modulation of signals at different power levels and advantageously for the signals to be non-coherent from each layer. In addition, independent modulation and coding of the signals may be performed. Backwards compatibility with legacy receivers, such as a quadrature phase shift keying (QPSK) receiver is enabled and new services are provided to new receivers. A typical new receiver of the present invention uses two demodulators and one remodulator as will be described in detail hereafter.

In a typical backwards-compatible embodiment of the present invention, the legacy QPSK signal is boosted in power to a higher transmission (and reception) level. This creates a power "room" in which a new lower layer signal may operate. The legacy receiver will not be able to distinguish the new lower layer signal, from additive white Gaussian noise, and thus operates in the usual manner. The optimum selection of the layer power levels is based on accommodating the legacy equipment, as well as the desired new throughput and services.

The new lower layer signal is provided with a sufficient carrier to thermal noise ratio to function properly. The new lower layer signal and the boosted legacy signal are non-coherent with respect to each other. Therefore, the new lower layer signal can be implemented from a different TWTA and even from a different satellite. The new lower layer signal format is also independent of the legacy format, e.g., it may be QPSK or 8 PSK, using the conventional concatenated FEC code or using a new Turbo code. The lower layer signal may even be an analog signal.

The combined layered signal is demodulated and decoded by first demodulating the upper layer to remove the upper carrier. The stabilized layered signal may then have the upper layer FEC decoded and the output upper layer symbols communicated to the upper layer transport. The upper layer symbols are also employed in a remodulator, to generate an idealized upper layer signal. The idealized upper layer signal is then subtracted from the stable layered signal to reveal the lower layer signal. The lower layer signal is then demodulated and FEC decoded and communicated to the lower layer transport.

Signals, systems and methods using the present invention may be used to supplement a pre-existing transmission compatible with legacy receiving hardware in a backwards-compatible application or as part of a preplanned layered modulation architecture providing one or more additional layers at a present or at a later date.

Layered Signals

FIGS. 1A–1C illustrate the basic relationship of signal layers in a layered modulation transmission. FIG. 1A illustrates a first layer signal constellation 100 of a transmission signal showing the signal points or symbols 102. FIG. 1B illustrates the second layer signal constellation of symbols 104 over the first layer signal constellation 100 where the layers are coherent. FIG. 1C illustrates a second signal layer 106 of a second transmission layer over the first layer constellation where the layers may be non-coherent. The second layer 106 rotates about the first layer constellation 102 due to the relative modulating frequencies of the two layers in a non-coherent transmission. Both the first and second layers rotate about the origin due to the first layer modulation frequency as described by path 108.

Figure 2B:
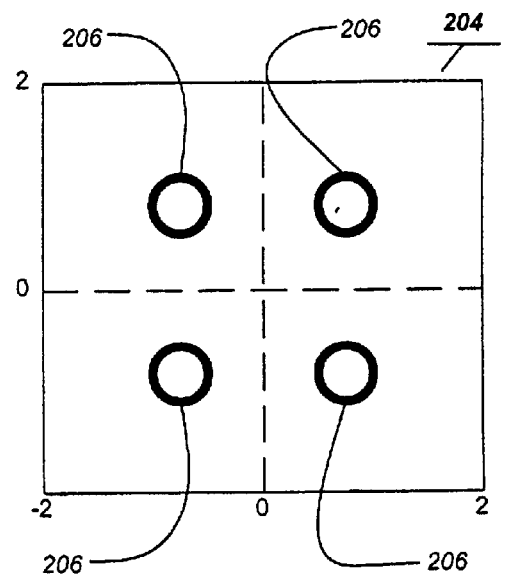
Figure 2C:
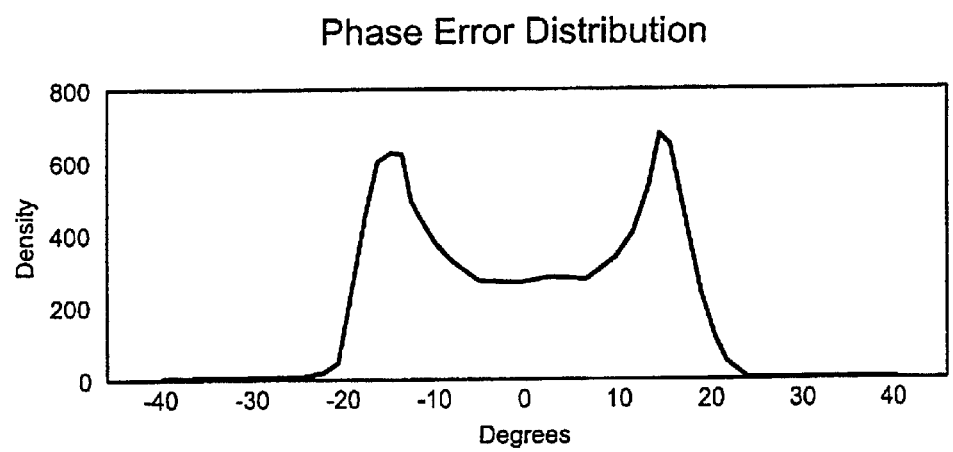

FIGS. 2A–2C illustrate a signal constellation of a second transmission layer over the first transmission layer after first layer demodulation. FIG. 2A shows the constellation 200 before the first carrier recovery loop (CRL) and FIG. 2B shows the constellation 200 after CRL. In this case, the signal points of the second layer are actually rings 202. FIG. 2C depicts a phase distribution of the received signal with respect to nodes 102. Relative modulating frequencies cause the second layer constellation to rotate around the nodes of the first layer constellation. After the second layer CRL this rotation is eliminated. The radius of the second layer constellation is determined by its power level. The thickness of the rings 202 is determined by the carrier to noise ratio (CNR) of the second layer. As the two layers are non-coherent, the second layer may also be used to transmit analog or digital signals.

Figure 3:
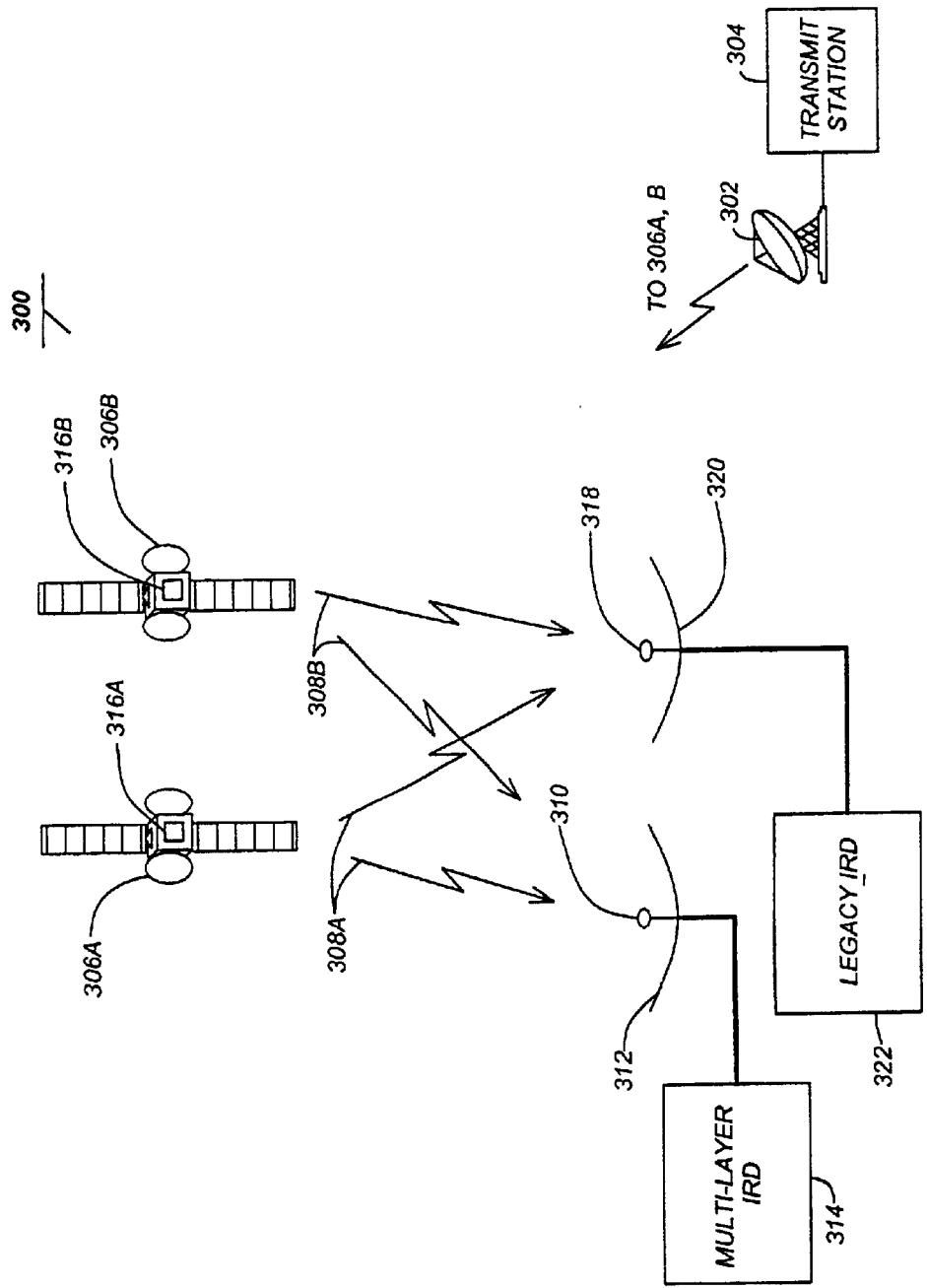
FIG. 3 is a block diagram for a typical system of the present invention.

FIG. 3 is a block diagram for a typical system 300 of the present invention. Separate transmitters 316A, 316B, as may be located on any suitable platform, such as satellites 306A, 306B, are used to non-coherently transmit different layers of a signal of the present invention. Uplink signals are typically transmitted to each satellite 306A, 306B from one or more transmit stations 304 via an antenna 302. The layered signals 308A, 308B (downlink signals) are received at receiver antennas 312, 320, such as satellite dishes, each with a low noise block (LNB) 310, 318 where they are then coupled to integrated receiver/decoders (IRDs) 314, 322. Because the signal layers may be transmitted non-coherently, separate transmission layers may be added at any time using different satellites 306A, 306B or other suitable platforms, such as ground based or high altitude platforms. Thus, any composite signal, including new additional signal layers will be backwards compatible with legacy receivers which will disregard the new signal layers. To ensure that the signals do not interfere, the combined signal and noise level for the lower layer must be at or below the allowed noise floor for the upper layer.

Hereafter the invention will be described in terms of particular applications which are backwards compatible and non-backwards compatible. "Backwards compatible" in this sense describes supplemental signal layers applied to systems previously implemented. In these applications, the pre-existing system architecture must be accommodated by the architecture of the additional signal layers. "Non-backwards compatible" describes a system architecture which makes use of layered modulation, but there is no pre-existing equipment.

The pre-existing legacy IRDs 322 decode and make use of data only from the layer (or layers) they were designed to receive, unaffected by the additional layers. However, as will be described hereafter, the legacy signals may be modified to optimally implement the new layers. The present invention may be applied to existing direct satellite services which are broadcast to individual users in order to enable additional features and services with new receivers without adversely affecting legacy receivers and without requiring additional signal frequency.

Demodulator and Decoder

Figure 4A:
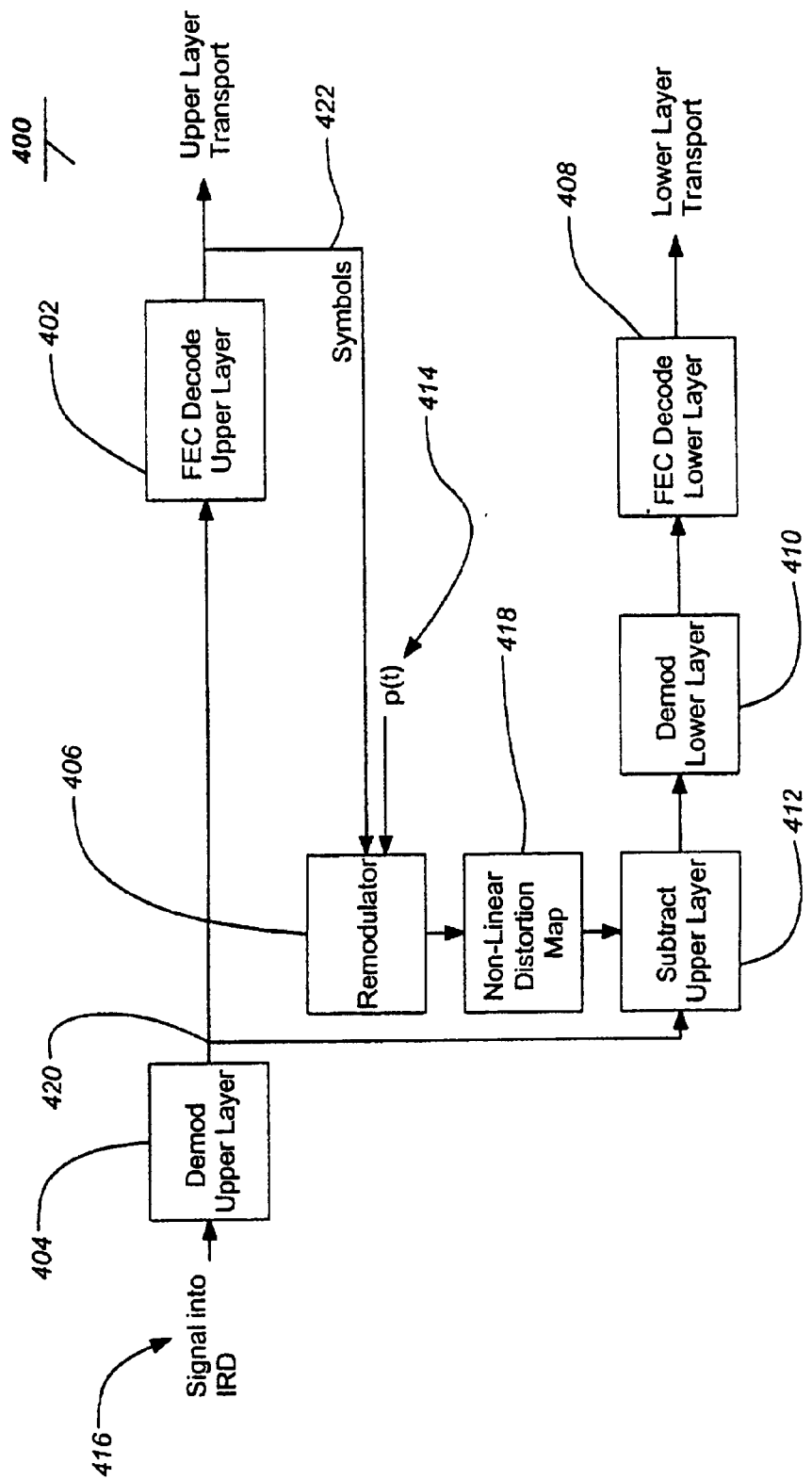
FIGS. 4A–4B are block diagrams for reception of first and second layered modulation by a typical receiver of the present invention.
Figure 4B:
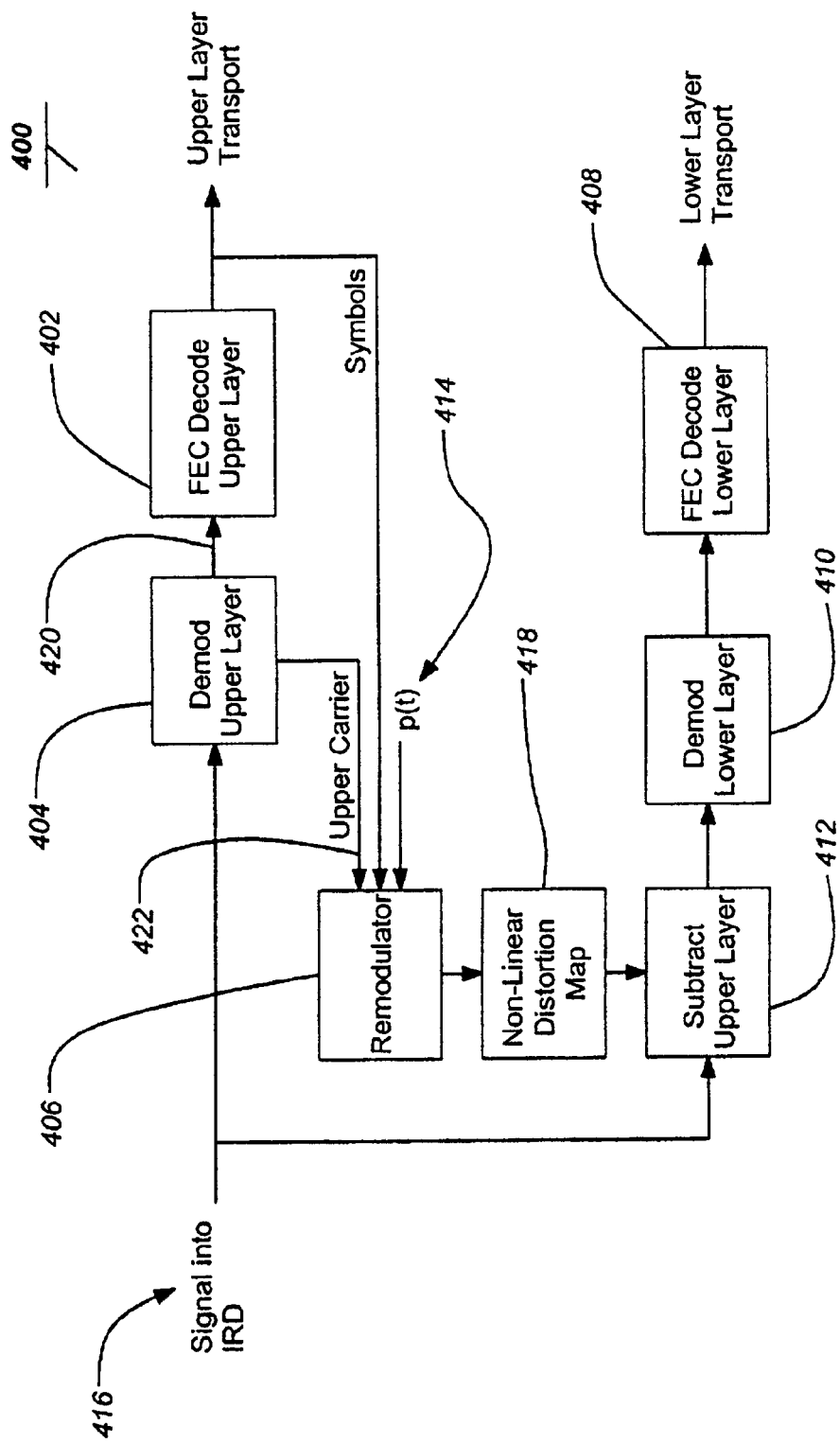

FIGS. 4A–4B are block diagrams for reception of a layered modulation signal by a typical receiver subsystem 400 of the present invention. FIG. 4A depicts reception where layer subtraction is performed on a signal where the upper carrier has been demodulated. The upper layer of the received combined signal 416, which may contain legacy modulation format, is processed by a demodulator 404 to produce the stable demodulated signal output 420. The demodulated signal is fed to a decoder 402 which FEC decodes the upper layer. The upper layer decoder 402 produces the upper layer symbols which are output to an upper layer transport and also used to generate an idealized upper layer signal. The upper layer symbols may be produced from the decoder 402 after Viterbi decode (BER<$10^{-3}$ or so) or after Reed-Solomon (RS) decode (BER<$10^{-9}$ or so), in typical decoding operations known to those skilled in the art. The upper layer symbols from the upper layer decoder 402 are fed to a remodulator 406 which effectively produces an idealized upper layer signal for subtraction from the stable demodulated signal 420.

In order for the subtraction to leave a clean small lower layer signal, the upper layer signal must be precisely reproduced. The modulated signal may have been distorted, for example, by TWTA non-linearity. The distortion effects are estimated from the received signal after the fact or from TWTA characteristics which may be downloaded into the IRD in AM-AM and/or AM-PM maps 418, used to eliminate the distortion.

A subtracter 412 then subtracts the idealized upper layer signal from the stable demodulated signal 420. This leaves the lower-power second layer signal. The subtracter includes a buffer or delay function to retain the stable demodulated signal 420 while the idealized upper layer signal is being constructed. The second layer signal is demodulated 410 and FEC decoded 408 according to its signal format.

FIG. 4B depicts reception where alternately layer subtraction is performed on the received layered signal. In this case, the demodulator 404 produces the upper carrier signal 422 (as well as the stable demodulated signal output 420). The upper carrier signal is output to the remodulator 406, which effectively produces an idealized upper layer signal which includes the upper layer carrier for subtraction from the received combined signal 416. Other equivalent methods of layer subtraction will occur to those skilled in the art and the present invention should not be limited to the examples provided here. Furthermore, those skilled in the art will understand that the present invention is not limited to two layers; additional layers may be included. Idealized upper layers are produced through remodulation from their respective layer symbols and subtracted. Subtraction may be performed on either the received combined signal or a demodulated signal. Finally, it is not necessary for all signal layers to be digital transmissions; the lowest layer may be an analog transmission.

The following analysis describes the exemplary two layer demodulation and decoding. It will be apparent to those skilled in the art that additional layers may be demodulated and decoded in a similar manner. The incoming combined signal is represented as:

$$s_{UL}(t) = f_U\left(M_U \exp(j\omega_U t + \theta_U) \sum_{m=-\infty}^{\infty} S_{Um} p(t - mT)\right) + f_L\left(M_L \exp(j\omega_L t + \theta_L) \sum_{m=-\infty}^{\infty} S_{Lm} p(t - mT + \Delta T_m)\right) + n(t)$$

where, $M_U$ is the magnitude of the upper layer QPSK signal and $M_L$ is the magnitude of the lower layer QPSK signal and $M_L << M_U$. The signal frequencies and phase for the upper and lower layer signals are respectively $\omega_U, \theta_U$ and $\omega_U, \theta_U$. The symbol timing misalignment between the upper and lower layers is $\Delta T_m$. $p(t-mT)$ represents the time shifted version of the pulse shaping filter p(t) 414 employed in signal modulation. QPSK symbols $S_{Um}$ and $S_{Lm}$ are elements of $$\left\{\exp\left(j\frac{n\pi}{2}\right), n = 0, 1, 2, 3\right\}.$$

$f_U(\bullet)$ and $f_L(\bullet)$ denote the distortion function of the TWTAs for the respective signals.

Ignoring $f_U(\bullet)$ and $f_L(\bullet)$ and noise n(t), the following represents the output of the demodulator 404 to the FEC decoder 402 after removing the upper carrier:

$$s'_{UL}(t) = M_U \sum_{m=-\infty}^{\infty} S_{Um} p(t - mT) + M_L \exp\{j(\omega_L - \omega_U)t + \theta_L - \theta_U\} \sum_{m=-\infty}^{\infty} S_{Lm} p(t - mT + \Delta T_m)$$

Because of the magnitude difference between $M_U$ and $M_L$, the upper layer decoder 402 disregards the $M_L$ component of the $s'_{UL}(t)$.

After subtracting the upper layer from $s_{UL}(t)$ in the subtracter 412, the following remains:

$$s_L(t) = M_L \exp\{j(\omega_L - \omega_U)t + \theta_L - \theta_U\} \sum_{m=-\infty}^{\infty} S_{Lm} p(t - mT + \Delta T_m)$$

Any distortion effects, such as TWTA nonlinearity effects are estimated for signal subtraction. In a typical embodiment of the present invention, the upper and lower layer frequencies are substantially equal. Significant improvements in system efficiency can be obtained by using a frequency offset between layers.

Using the present invention, two-layered backward compatible modulation with QPSK doubles a current 6/7 rate capacity by adding a TWTA approximately 6.2 dB above an existing TWTA power. New QPSK signals may be transmitted from a separate transmitter, from a different satellite for example. In addition, there is no need for linear travelling wave tube amplifiers (TWTAs) as with 16 QAM. Also, no phase error penalty is imposed on higher order modulations such as 8 PSK and 16 QAM.

Backward Compatible Applications

Figure 5A:
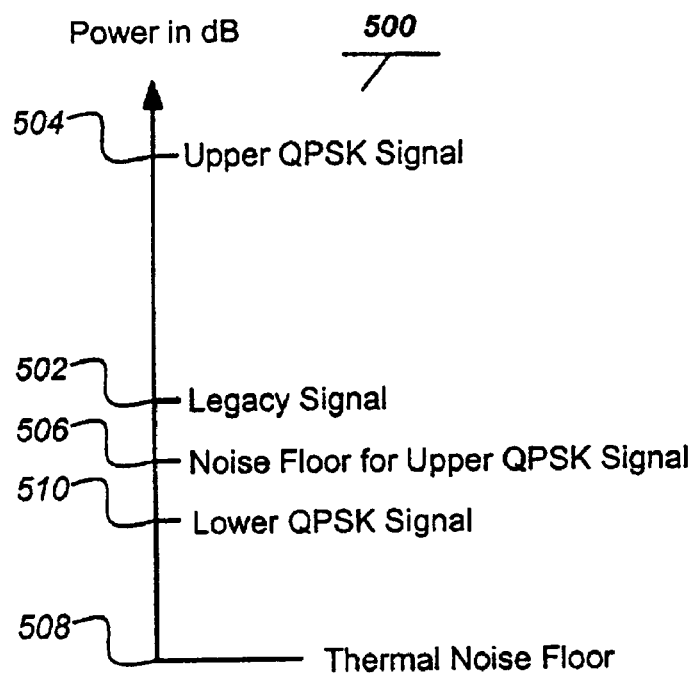
FIGS. 5A–5B depict the power levels for example embodiments of the present invention.

FIG. 5A depicts the relative power levels 500 of example embodiments of the present invention. FIG. 5A is not a scale drawing. This embodiment doubles the pre-existing rate 6/7 capacity by using a TWTA 6.2 dB above a pre-existing TWTA equivalent isotropic radiated power (EIRP) and second TWTA 2 dB below the pre-existing TWTA power.

This embodiment uses upper and lower QPSK layers which are non-coherent. A code rate of 6/7 is also used for both layers. In this embodiment, the signal of the legacy QPSK signal 502 is used to generate the upper layer 504 and a new QPSK layer is the lower layer 510. The CNR of the legacy QPSK signal 502 is approximately 7 dB. In the present invention, the legacy QPSK signal 502 is boosted in power by approximately 6.2 dB bringing the new power level to approximately 13.2 dB as the upper layer 504. The noise floor 506 of the upper layer is approximately 6.2 dB. The new lower QPSK layer 510 has a CNR of approximately 5 dB. The total signal and noise of the lower layer is kept at or below the tolerable noise floor 506 of the upper layer. The power boosted upper layer 504 of the present invention is also very robust, making it resistant to rain fade. It should be noted that the invention may be extended to multiple layers with mixed modulations, coding and code rates.

In an alternate embodiment of this backwards compatible application, a code rate of 2/3 may be used for both the upper and lower layers 504, 510. In this case, the CNR of the legacy QPSK signal 502 (with a code rate of 2/3) is approximately 5.8 dB. The legacy signal 502 is boosted by approximately 5.3 dB to approximately 11.1 dB (4.1 dB above the legacy QPSK signal 502 with a code rate of 2/3) to form the upper QPSK layer 504. The new lower QPSK layer 510 has a CNR of approximately 3.8 dB. The total signal and noise of the lower layer 510 is kept at or below approximately 5.3 dB, the tolerable noise floor 506 of the upper QPSK layer. In this case, overall capacity is improved by 1.55 and the effective rate for legacy IRDs will be 7/9 of that before implementing the layered modulation.

In a further embodiment of a backwards compatible application of the present invention the code rates between the upper and lower layers 504, 510 may be mixed. For example, the legacy QPSK signal 502 may be boosted by approximately 5.3 dB to approximately 12.3 dB with the code rate unchanged at 6/7 to create the upper QPSK layer 504. The new lower QPSK layer 510 may use a code rate of 2/3 with a CNR of approximately 3.8 dB. In this case, the total capacity relative to the legacy signal 502 is approximately 1.78. In addition, the legacy IRDs will suffer no rate decrease.

Non-Backward Compatible Applications

As previously discussed the present invention may also be used in "non-backward compatible" applications. In a first example embodiment, two QPSK layers 504, 510 are used each at a code rate of 2/3. The upper QPSK layer 504 has a CNR of approximately 4.1 dB above its noise floor 506 and the lower QPSK layer 510 also has a CNR of approximately 4.1 dB. The total code and noise level of the lower QPSK layer 510 is approximately 5.5 dB. The total CNR for the upper QPSK signal 504 is approximately 9.4 dB, merely 2.4 dB above the legacy QPSK signal rate 6/7. The capacity is approximately 1.74 compared to the legacy rate 6/7.

Figure 5B:
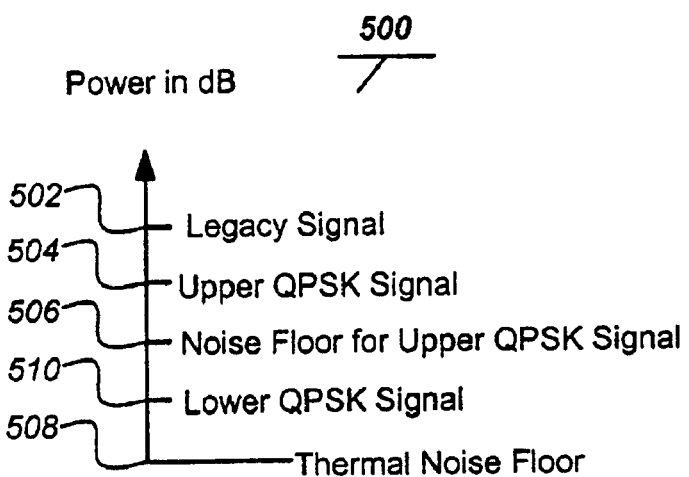

FIG. 5B depicts the relative power levels of an alternate embodiment wherein both the upper and lower layers 504, 510 are below the legacy signal level 502. The two QPSK layers 504, 510 use a code rate of 1/2. In this case, the upper QPSK layer 504 is approximately 2.0 dB above its noise floor 506 of approximately 4.1 dB. The lower QPSK layer has a CNR of approximately 2.0 dB and a total code and noise level at or below 4.1 dB. The capacity of this embodiment is approximately 1.31 compared to the legacy rate 6/7.

CONCLUSION

The foregoing description including the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto. The above specification, examples and data provide a complete description of the manufacture and use of the invention. Since many embodiments of the invention can be made without departing from the scope of the invention, the invention resides in the claims hereinafter appended.

What is claimed is:

1. A method of transmitting a transmitting signal having a legacy upper layer signal receivable by a plurality of legacy receivers and a plurality of layered modulation receivers and a lower layer signal non-coherently layered over the legacy upper layer signal, the lower layer signal receivable by the layered modulation receivers and not receivable by the legacy receivers, the method, comprising:

transmitting the legacy upper layer signal including a first carrier and first signal symbols; and transmitting a lower layer signal including a second carrier and second signal symbols;

wherein the layered modulation receivers demodulate the legacy upper layer signal to produce the first signal symbols, remodulate the first signal symbols, and subtract the remodulated first signal symbols from she demodulated legacy upper layer signal to produce the second signal symbols.

2. The method of claim 1, wherein at least one of the legacy upper layer signal and the lower layer signal are quadrature phase shift keyed (QPSK).

3. The method of claim 1, wherein a code rate for at least one of the legacy upper layer signal and lower layer signal is 6/7.

4. The method of claim 1, wherein a code rate for at least one of the legacy upper layer signal and lower layer signal is 2/3.

5. The method of claim 1, wherein a code rate for at least one of the legacy upper layer signal and lower layer signal is 1/2.

6. The method of claim 1, wherein the lower layer signal is generated by power boosting a legacy signal.

7. The method of claim 1, wherein a total code and noise level of the legacy upper layer signal is no greater than a noise floor of the second signal layer.

8. The method of claim 1, wherein at least one of the legacy upper layer signal and lower layer signal is coded using a turbo code.

9. The method of claim 1, wherein both the legacy upper layer signal and lower layer signal are coded using a single turbo code.

10. A receiver for compatibly receiving a transmission signal having a legacy upper layer signal receivable by a plurality of legacy receivers and a plurality of layered modulation receivers and a lower layer signal non-coherently layered over the legacy upper layer signal, the lower layer signal receivable by the layered modulation receivers and not receivable by the legacy receivers, the receiver comprising:

a first demodulator for demodulating the legacy upper layer signal to produce a demodulated signal;

a first layer decoder, coupled to the first layer demodulator, for decoding the demodulated signal to produce legacy upper layer signal symbols;

a remodulator, coupled to the first layer decoder, for remodulating the first signal symbols to produce a remodulated legacy upper layer signal;

a subtracter, coupled to the first demodulator and the remodulator, for subtracting the remodulated legacy upper layer signal from the demodulated signal to produce the lower layer signal;

a second layer demodulator, coupled to the subtracter, the second layer demodulator for demodulating the lower layer signal to produce a second demodulator output; and a second layer decoder, coupled to the second layer demodulator, the second layer decoder for decoding the second layer demodulated output to produce lower layer signal symbols.

11. The receiver system of claim 10, further comprising a non-linear distortion map for removing non-linear distortion effects from the remodulated legacy upper layer signal.

12. The receiver of claim 11, wherein the non-linear distortion map is estimated from the transmission signal.

13. The receiver of claim 11, wherein the non-linear distortion map is estimated from transmission signal transmitter characteristics.

14. The receiver of claim 13, wherein the transmission signal transmitter characteristics are downloaded to the receiver.

15. The receiver system of claim 10, wherein the legacy upper layer signal is a boosted legacy signal.

16. The receiver system of claim 10, wherein at least one of the legacy upper layer signal and lower layer signal are quadrature phase shift keyed (QPSK).

17. The receiver system of claim 10, wherein a code rate for at least one of the legacy upper layer signal and lower layer signal is 6/7.

18. The receiver system of claim 10, wherein a code rate for at least one of the legacy upper layer signal and lower layer signal is 2/3.

19. The receiver system of claim 10, wherein a code rate for at least one of the legacy upper layer signal and lower layer signal is 1/2.

20. The receives system of claim 10, wherein the second signal layer is generated by power boosting the legacy upper layer signal.

21. The receiver system of claim 10, wherein a total code and noise level of the legacy upper layer signal is no greater than a noise floor of the lower layer signal.

22. The receiver system of claim 10, wherein at least one of the legacy upper layer signal and lower layer signal is coded using a turbo code.

23. The receiver system of claim 10, wherein both the legacy upper layer signal and lower layer signal are coded using a single turbo code.

24. The receiver system of claim 10, wherein the legacy upper layer signal and lower layer signal each have a carrier frequency that is substantially similar.

25. The receiver system of claim 10, wherein a carrier frequency of the legacy upper layer signal and a second carrier frequency of the lower layer signal are offset in frequency.

26. The receiver system of claim 10, wherein the the first layer decoder comprises a Viterbi decode.

27. The receiver system of claim 10, wherein the the first layer decoder comprises a Reed-Solomon decoder.

28. A method of receiving a transmission signal having a legacy upper layer signal compatibly receivable by a plurality of legacy receivers and a plurality of layered modulation receivers and a lower layer signal non-coherently layered over the upper layer signal, the lower layer signal receivable by the layered modulation receivers and not receivable by the legacy receivers, the method comprising:

demodulating the legacy upper layer signal of the transmission signal to produce a demodulated signal;

decoding the demodulated signal to produce legacy upper layer symbols;

remodulating the legacy upper layer symbols;

subtracting the remodulated legacy upper layer symbols from the demodulated signal to produce the lower layer signal;

demodulating the lower layer signal; and decoding the demodulated lower layer signal to produce second decoded symbols.

29. The method of claim 28, wherein the legacy upper layer signal includes non-linear distortion, and the method further comprises the step of:

removing non-linear distortion effects from the remodulated legacy upper layer symbols before subtracting the remodulated legacy upper layer symbols from the demodulated signal.

30. The method of claim 29, wherein the non-linear distortion effects are estimated from the transmission signal.

31. The method of claim 29, wherein the non-linear distortion effects are estimated from transmission signal transmitter characteristics.

32. The method of claim 28, wherein the a frequency $\omega_U$ of the legacy upper layer signal and a frequency $\omega_L$ of the lower layer signal are offset.

33. The method of claim 28, wherein the legacy upper layer symbols are remodulated according to a pulse shaping filter p(t).

34. The method of claim 28, wherein at least one of the legacy upper layer signal and the lower layer signal are quadrature phase shift keyed (QPSK).

35. The method of claim 28, wherein a code rate for at least one of the legacy upper layer signal and the lower layer signal is 6/7.

36. The method of claim 28, wherein a code rate for at least one of the legacy upper layer signal and the lower layer signal is 2/3.

37. The method of claim 28, wherein a code rate for at least one of the legacy upper layer signal and the lower layer signal is 1/2.

38. The method of claim 28, wherein the lower layer signal is generated by power boosting legacy upper layer signal.

39. The method of claim 28, wherein a total code and noise level of the legacy upper layer signal is no greater than a noise floor of the lower layer signal.

40. The method of claim 28, wherein at least one of the legacy upper layer signal and the lower layer signal is coded using a turbo code.

41. The method of claim 28, wherein both the legacy upper layer signal and the lower layer signal are coded using a single turbo code.

42. The method of claim 28, wherein the legacy upper layer signal and lower layer signal each have a carrier frequency that is substantially similar.

43. The method of claim 28, wherein a carrier frequency of the legacy upper layer signal and a second carrier frequency of the lower layer signal are offset in frequency.

44. The method of claim 28, wherein step of decoding the demodulated signal to produce legacy upper layer symbols comprises the step of Viterbi decoding the demodulated signal.

45. The method of claim 28, wherein the step of decoding the demodulated signal to produce upper layer symbols comprises the step of Reed-Solomon decoding the demodulated signal.

* * * * *